United States Patent [19]
Olsen et al.

[11] Patent Number: 5,536,321
[45] Date of Patent: Jul. 16, 1996

[54] PARYLENE DEPOSITION APPARATUS INCLUDING A POST-PYROLYSIS FILTERING CHAMBER AND A DEPOSITION CHAMBER INLET FILTER

[75] Inventors: Roger A. Olsen, Amery, Wis.; John Wary, Noblesville, Ind.; William F. Beach, Bridgewater, N.J.

[73] Assignee: Specialty Coating Systems, Inc., Indianapolis, Ind.

[21] Appl. No.: 549,131

[22] Filed: Oct. 27, 1995

[51] Int. Cl.$^6$ ................................................ C23C 16/00
[52] U.S. Cl. .................. 118/719; 118/715; 118/722; 118/725; 118/726; 118/728; 427/255.6
[58] Field of Search ..................................... 118/715, 719, 118/722, 725, 726, 728; 427/255.6

[56] References Cited

U.S. PATENT DOCUMENTS

| | | |
|---|---|---|
| 3,472,795 | 10/1969 | Tittmann et al. . |
| 4,495,889 | 1/1985 | Riley . |
| 4,518,623 | 5/1985 | Riley . |
| 4,683,143 | 7/1987 | Riley ................................. 427/255.6 |
| 5,007,372 | 4/1991 | Hattori et al. . |
| 5,123,375 | 6/1992 | Hansen . |
| 5,268,033 | 12/1993 | Stewart . |

Primary Examiner—Richard Bueker
Attorney, Agent, or Firm—Salter & Michaelson

[57] ABSTRACT

Chemical vapor deposition apparatus is provided for the quick and efficient deposition of Parylene AF4 onto silicon wafers in the production of semiconductor chips. The apparatus includes a post-pyrolysis chamber maintained at a predetermined temperature for capturing unpyrolyzed dimer before entry into the deposition chamber, and a filter structure positioned at the deposition chamber inlet to filter out microscopic particles and impurities prior to deposition onto the wafer surface. The post-pyrolysis chamber includes baffles for capturing the unpyrolyzed dimer, and the filter material preferably comprises PTFE. The filter element is heated to prevent deposition onto the filter.

10 Claims, 8 Drawing Sheets

PARYLENE DEPOSITION APPARATUS INCLUDING A POST-PYROLYSIS FILTERING CHAMBER AND A DEPOSITION CHAMBER INLET FILTER

RELATED APPLICATIONS

This application is related to the following copending commonly assigned patent applications: Ser. No. 549,093, filed Oct. 27, 1995, and entitled PARYLENE DEPOSITION APPARATUS INCLUDING AN ATMOSPHERIC SHROUD AND INERT GAS SOURCE; Ser. No. 549,395, filed Oct. 27, 1995, and entitled PARYLENE DEPOSITION APPARATUS INCLUDING A HEATED AND COOLED DIMER CRUCIBLE; Ser. No. 549,635, filed Oct. 27, 1995, and entitled PARYLENE DEPOSITION APPARATUS INCLUDING A HEATED AND COOLED SUPPORT PLATEN AND AN ELECTROSTATIC CLAMPING DEVICE; Ser. No. 549,169, filed Oct. 27, 1995, and entitled PARYLENE DEPOSITION APPARATUS INCLUDING A TAPERED DEPOSITION CHAMBER AND DUAL VACUUM OUTLET PUMPING ARRANGEMENT; Ser. No. 549,087, filed Oct. 27, 1995, and entitled METHOD AND APPARATUS FOR THE DEPOSITION OF PARYLENE AF4 ONTO SEMICONDUCTOR WAFERS; Ser. No. 549,133, filed Oct. 27,1995, and entitled PARYLENE DEPOSITION APPARATUS INCLUDING A QUARTZ CRYSTAL THICKNESS/RATE CONTROLLER; and Ser. No. 549,130, filed Oct. 27, 1995, and entitled PARYLENE DEPOSITION APPARATUS INCLUDING DRY VACUUM PUMP SYSTEM AND DOWNSTREAM COLD TRAP.

BACKGROUND AND SUMMARY OF THE INVENTION

The instant invention relates to chemical vapor deposition (CVD) apparatus and methods, and more particularly to a parylene deposition apparatus including a post-pyrolysis chamber for capturing unpyrolyzed dimer prior to entry into the deposition chamber, and further including a filter assembly disposed at the inlet of the deposition chamber to filter out sub-microscopic particles and impurities prior to deposition onto a substrate.

Parylene is a general term used to describe a class of poly-p-xylylenes which are derived from a dimer having the structure:

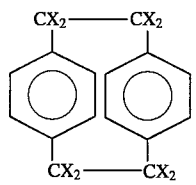

wherein X is typically a hydrogen, or a halogen. The most commonly used forms of parylene dimers include the following:

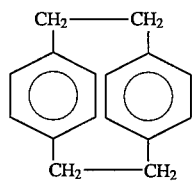
PARYLENE N

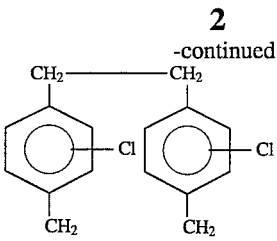
PARYLENE C

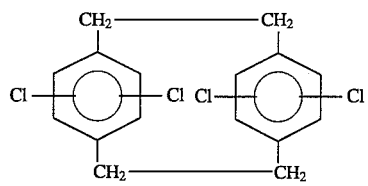
PARYLENE D

Parylene coatings are obtained from their related parylene dimers by means of a well-known vapor deposition process in which the dimer is vaporized, pyrolized, i.e. cleaved into a monomer vapor form, and fed to a deposition chamber wherein the monomer molecules deposit and polymerize onto a substrate disposed within the deposition chamber. The process occurs according to the following reaction:

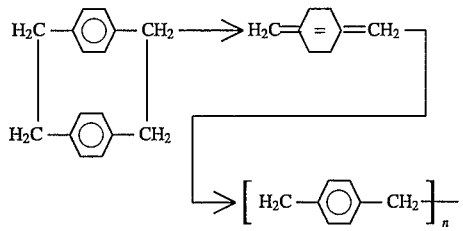

Due to their ability to provide thin films and conform to substrates of varied geometric shapes, parylene polymers are ideally suited for use as a conformal external coating in a wide variety of fields, such as for example, in the electronics, automotive, and medical industries.

Octafluoro-[2,2]paracyclophane (Parylene AF4 dimer) is a fluorine substituted version of the above-noted parylene dimers and has the structure:

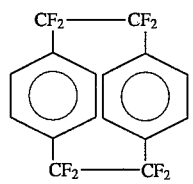

It is known that parylene coatings which are derived from the AF4 dimer by the vapor deposition process have a very high melting temperature (about 500° C.) and a very low dielectric constant (about 2.3). These characteristics make Parylene AF4 ideally suited for many high temperature applications, including, electronic applications, and potentially as an inter-layer dielectric material in the production of semiconductor chips. The existing parylene coating systems as used with Parylene C, D, and N, typically include a multi-chamber vacuum system comprising a vaporization chamber, a pyrolysis chamber coupled to the vaporization chamber, and a deposition chamber coupled to the pyrolysis chamber in which the monomer vapor deposits onto a substrate and polymerizes. The coating systems further include a vacuum system coupled to the chambers for creating sub-atmospheric pressure conditions throughout the chamber system. While the existing parylene deposition systems are highly effective in depositing parylene polymers as an external coating on a variety of articles, there are unique characteristics of semiconductor wafers which prevent the existing parylene coating systems from providing sufficient coating purity to be compatible with existing semiconductor chip manufacturing technologies.

One aspect to semiconductor chip technology is that the environment surrounding the chip wafers during manufacture is normally defined as a clean-room setting wherein virtually all airborne particles are filtered from the environment. Due to the ever decreasing sizes of trace lines and circuit structures, the presence of even a small dust particle, or chemical impurity, on the surface of a wafer is disastrous. The problem with conventional parylene deposition systems is that the parylene vaporization and pyrolysis processes are inherently micro dirty processes, i.e. the reactive monomer vapor is normally laden with foreign airborne particles, and unpyrolyzed dimer which has escaped the pyrolysis chamber. Such impurities have heretofore not been considered a problem, since most parylene coatings are utilized in an external protective coating.

Accordingly, there is currently presented a need for a parylene deposition system particularly suited to providing a highly pure parylene AF4 reactive monomer for deposition onto semiconductor wafers. In this regard, the instant invention provides a parylene deposition system comprising a vaporization chamber, a pyrolysis chamber, a post-pyrolysis chamber for capturing unpyrolyzed dimer prior to entry into the deposition chamber, a deposition bell having a frustoconical shape to minimize chamber volume and maximize vapor flow, a filter structure positioned at the deposition chamber inlet to filter out microscopic particles and impurities prior to deposition onto the wafer surface, a platen assembly for supporting a semiconductor wafer, an electrostatic clamping device for clamping the wafer in intimate thermal contact with the platen, and a vacuum system for creating sub-atmospheric conditions within the multi-chamber vacuum system.

The vaporization chamber, pyrolysis chamber, post-pyrolysis chamber, and vacuum system, are located within a rectangular housing structure. The platen assembly is preferably located on a top surface of the housing to facilitate placement and removal of the wafers on the platen assembly. The deposition bell is received and secured over the platen assembly to form a deposition chamber. The deposition bell and its associated inlet and outlet pipes and are formed as a single removable unit, and are arranged so as to provide a mating engagement of the deposition bell with the top of the platen and a mating engagement of the inlet and outlet pipes with corresponding fittings on the top of the housing. The removable deposition bell further facilitates access to the platen assembly for the placement and removal of wafers.

The post pyrolysis chamber comprises a cylindrical housing having a plurality of baffle elements disposed in the interior thereof. The reactive monomer exiting from the pyrolysis chamber passes through the post-pyrolysis chamber on its way to the deposition chamber. The post-pyrolysis chamber is maintained at a predetermined temperature conducive to the deposition of the unpyrolyzed dimer, whereby the post-pyrolysis chamber is effective for capturing any unpyrolyzed dimer that may exit the pyrolysis chamber. The outlet of the post-pyrolysis chamber terminates in a fitting located on the top of the housing, and is coupled to the inlet pipe of the deposition bell. The filter structure is disposed adjacent to the inlet end of the deposition bell and preferably comprises a sheet of PTFE filter material captured between two complementary rings which are secured to the inner walls of the deposition bell. The PTFE material is fine enough to effectively filter out sub-microscopic particles while still allowing a sufficient vapor flow through the system, i.e. without the creation of a significant pressure drop across the filter. The combination of the post-pyrolysis chamber and the filter structure is believed to be sufficient to provide the required coating purity for semiconductor wafers.

Accordingly, among the objects of the instant invention are: the provision of a parylene deposition apparatus effective for clean and efficient deposition of Parylene AF4 onto silicon wafers in the production of semiconductor chips; the provision of a parylene deposition apparatus including a post-pyrolysis chamber maintained at a predetermined temperature to effectively capture unpyrolyzed dimer before entry into the deposition chamber; the provision of a parylene deposition apparatus including a filter structure positioned at the deposition chamber inlet to filter out microscopic particles and impurities prior to deposition onto the wafer surface; and the further provision of means for fast, efficient, clean and cost effective deposition of Parylene Af4 onto the surface of a silicon wafer.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE PREFERRED EMBODIMENT

Figure 1:
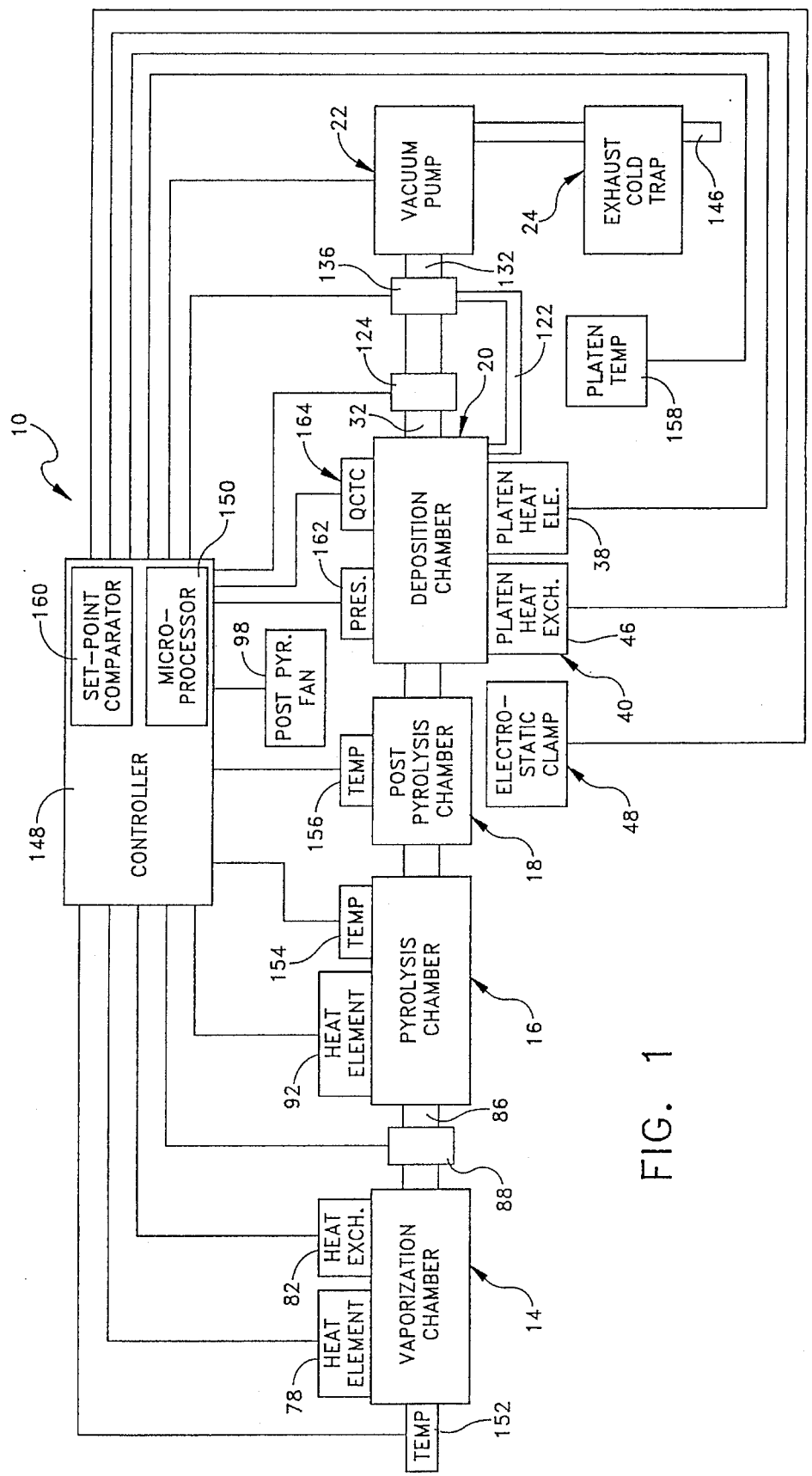
FIG. 1 is a schematic drawing of the parylene vapor deposition apparatus of the instant invention.
Figure 2:
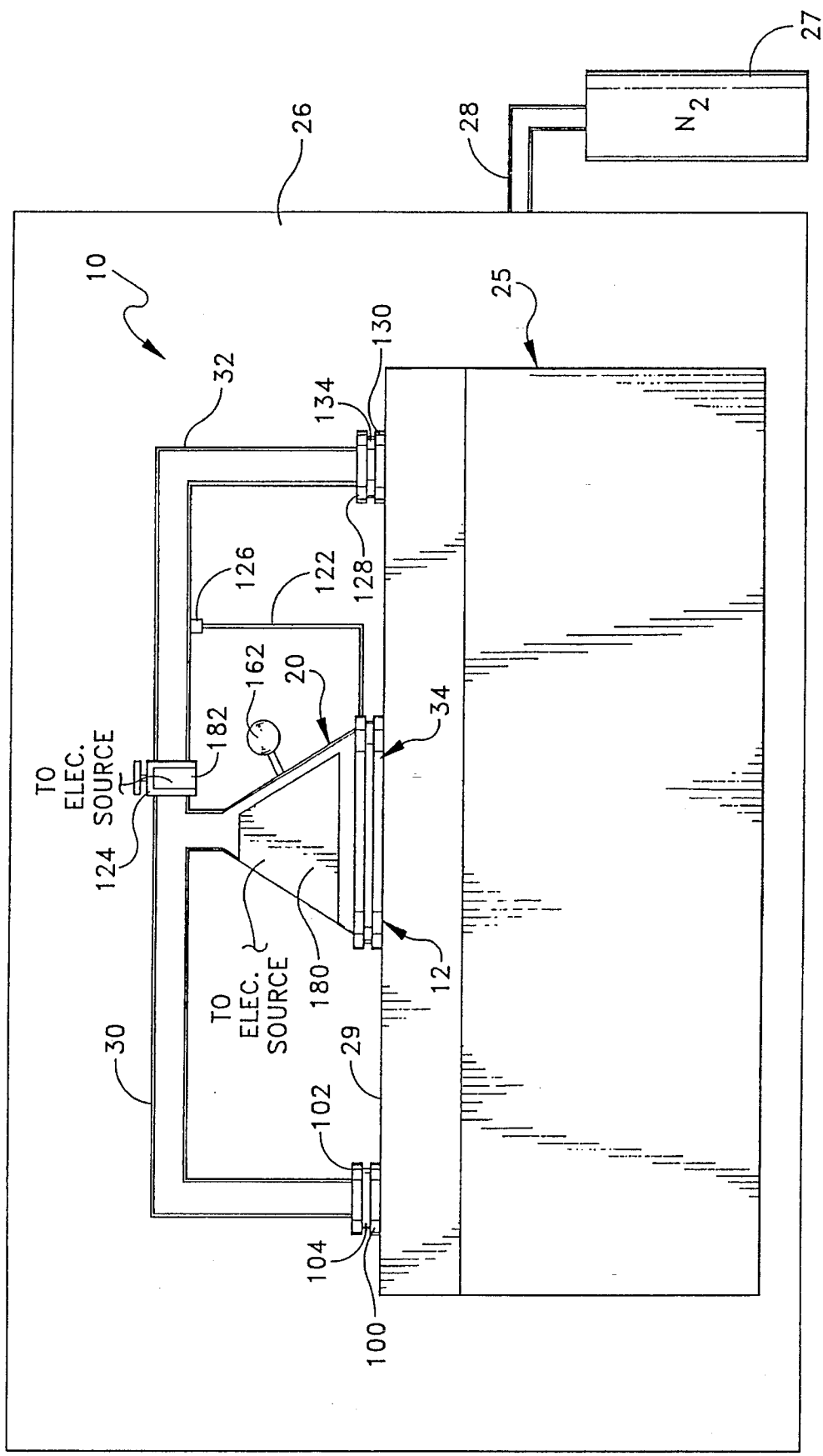
FIG. 2 is a front elevational view of the parylene deposition apparatus of the instant invention.

Referring now to the drawings, a parylene deposition apparatus in accordance with the instant invention is illustrated and generally indicated at 10 in FIGS. 1–11. As will hereinafter be more fully described, the instant parylene deposition apparatus 10 is effective for the quick and efficient deposition of Parylene AF4 material onto the surface of a silicon wafer.

Referring to FIG. 1, the parylene deposition apparatus 10 generally comprises a platen assembly generally indicated at 12 for supporting a semiconductor wafer 13, a vaporization chamber generally indicated at 14, a pyrolysis chamber generally indicated at 16, a post-pyrolysis chamber generally indicated at 18, a deposition bell generally indicated at 20, a vacuum pump 22, and a cold trap generally indicated at 24. Referring to FIGS. 2–7, the vaporization chamber 14, pyrolysis chamber 16, post-pyrolysis chamber 18, vacuum pump 22, and cold trap 24 are located within a rectangular housing structure as generally indicated at 25 in FIGS. 2–7. The apparatus 10 further comprises an atmospheric shroud 26 which completely envelopes the entire apparatus 10, and a source of nitrogen gas 27 which is introduced into the shroud 26 by a suitable pipe assembly 28.

The platen assembly 12 is preferably located on a top wall 29 of the housing 25 to facilitate placement and removal of the wafers 13 on the platen assembly 12. The deposition bell 20 is received and secured over the platen assembly 12 to form a deposition chamber. The deposition bell 20 and its associated inlet and outlet pipes 30 and 32 respectively, are preferably formed as a single removable unit (See FIG. 3), and are arranged so as to provide a mating engagement of the deposition bell 20 with the top of the platen assembly 12 and a mating engagement of the inlet and outlet pipes 30, 32 with corresponding fittings on the top wall 29 of the housing 25. The removable deposition bell 20 further facilitates access to the platen assembly 12 for the placement and removal of wafers 13. While there is shown and described a specific arrangement of the platen assembly 12 and removable deposition bell 20, it is to be understood that other arrangements are also within the scope of the invention.

Figure 3:
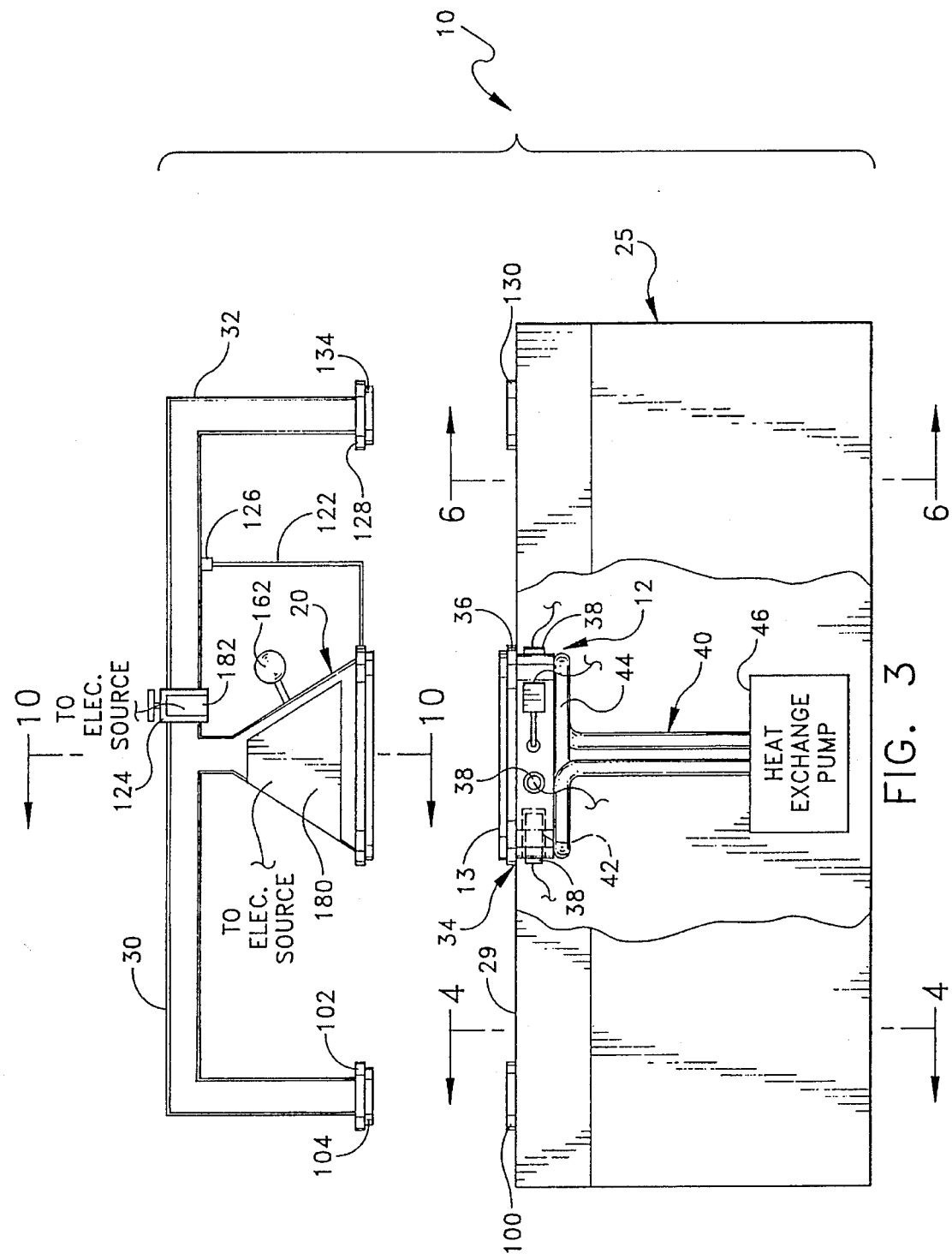
FIG. 3 is another front elevational view with the deposition chamber sub-assembly separated from the base, and a portion of the base portion broken away to illustrate the heated and cooled platen assembly of the invention.
Figure 7:
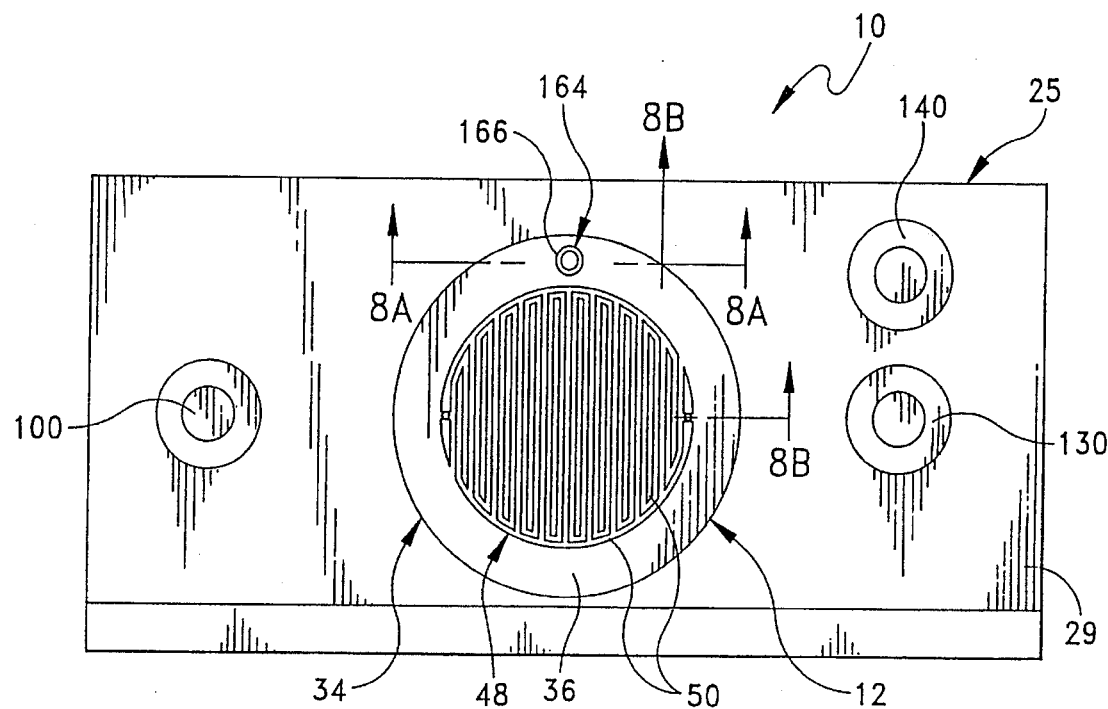
FIG. 7 is a top view of the base illustrating the platen, and vacuum ports.
Figure 8B:
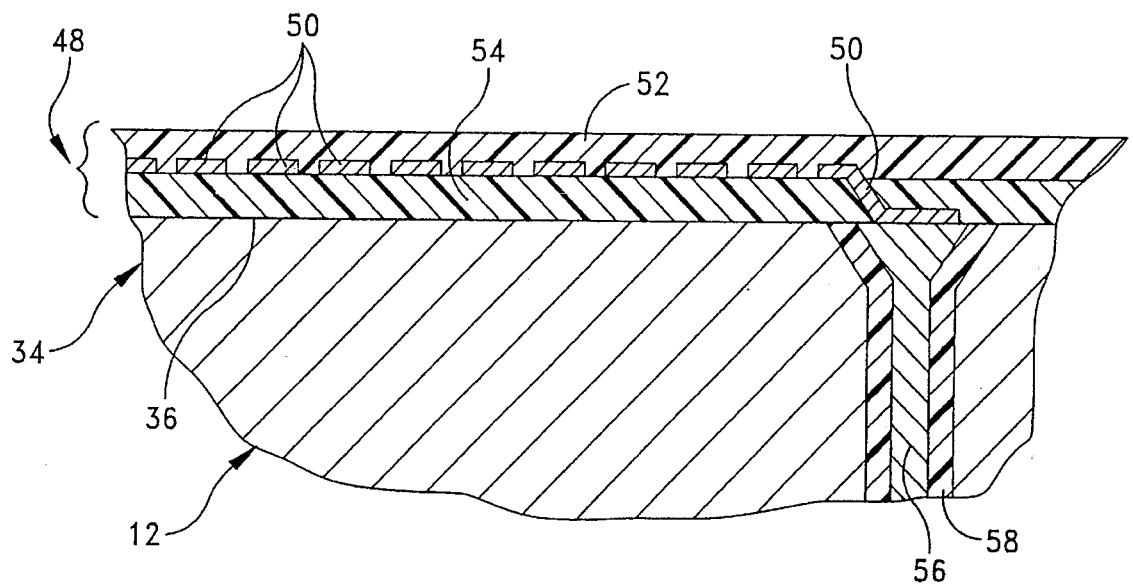
FIG. 8B is an enlarged cross-sectional view of the platen and electrostatic clamping device of the instant invention as taken along line 8B—8B of FIG. 7.
Figure 9:
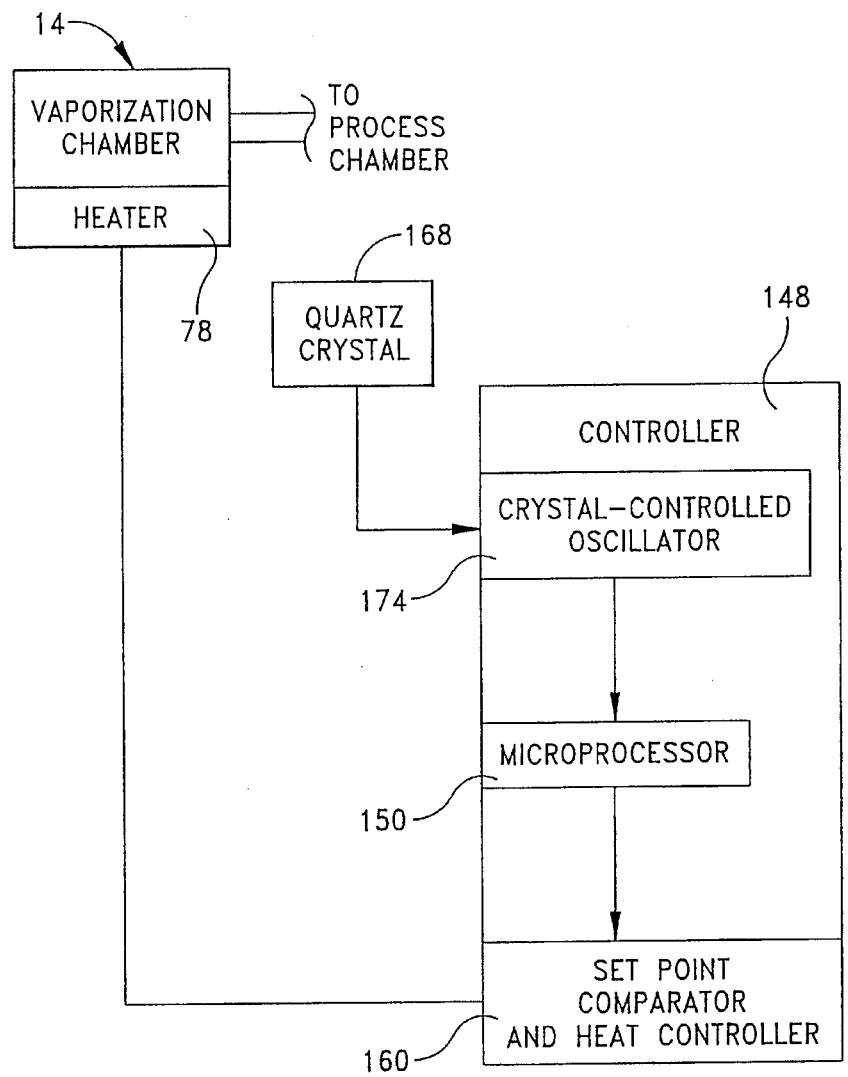
FIG. 9 is a schematic view of the quartz crystal thickness/rate sensor control system of the invention.
Figure 8A:
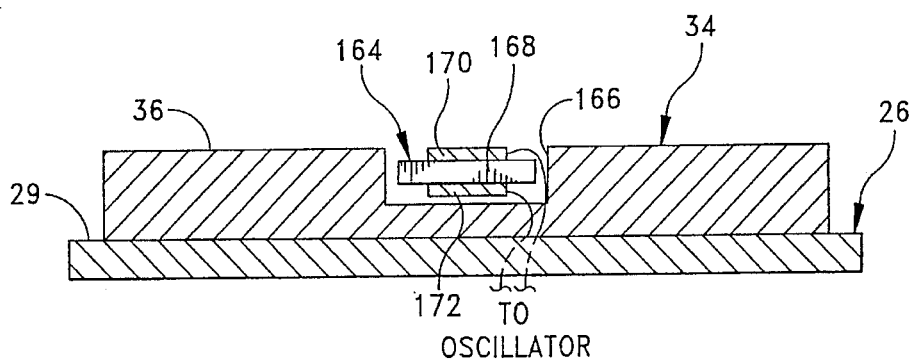
FIG. 8A is a cross-sectional view of the quartz crystal thickness/rate sensor on the invention as taken along line-8A—8A of FIG. 7.
Figure 10:
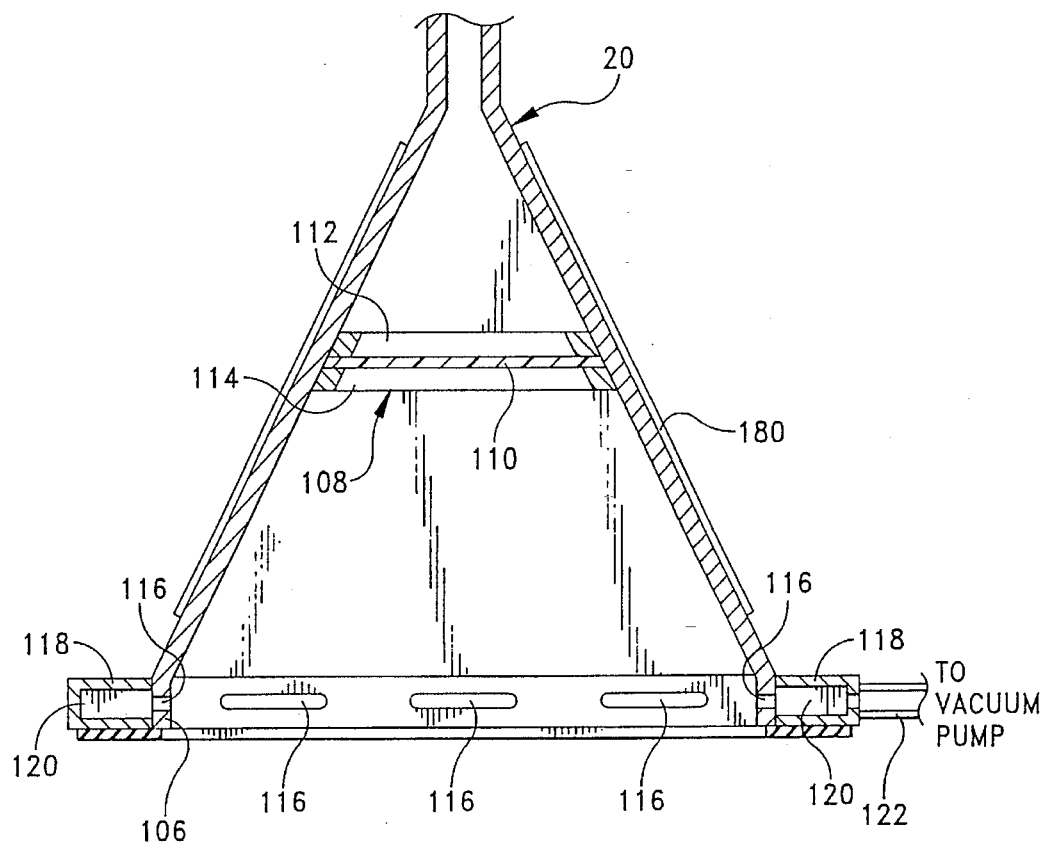
FIG. 10 is a cross-sectional view of the deposition chamber body as taken along line 10—10 of FIG. 3.
Figure 11:
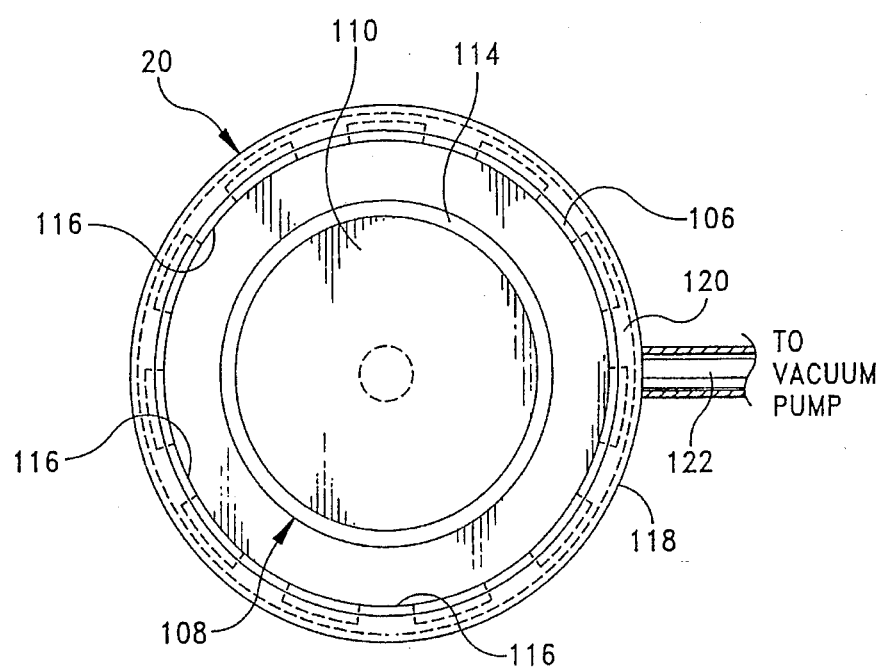
FIG. 11 is a bottom view of the deposition chamber body illustrating the distribution of the openings in the vacuum manifold.

Referring to FIGS. 3, 7 and 8B, the platen assembly 12 comprises a thermally conductive platen generally indicated at 34 having a supporting surface 36 for supporting a wafer 13 to be coated, a plurality of electric heater elements 38 for heating the platen 34 to a predetermined temperature, and a cooling sub-assembly 40 for cooling the platen 34 to a predetermined temperature. It has been found that Parylene AF4 vapor condenses or polymerizes most effectively on surfaces which have been chilled to a temperature of below 0° C. The platen 34 of the instant invention provides an effective surface 36 for supporting a semiconductor wafer 13 within the deposition bell 20, and further provides an effective means for heating and cooling the wafer 13 to desired temperatures during the coating process. More specifically, the heating and cooling of a wafer 12 is accomplished by means of heat conduction through contact with the platen 34. The platen 34 is preferably constructed from a metallic material which has very good thermal conduction characteristics. In this regard, brass and copper are suitable metallic materials for construction of the platen 34. The heating elements 38 for heating the platen 34 comprise electric cartridge heating elements which are inserted into radially extending openings 42 formed in a body portion of the platen 34 (See FIG. 3). The cooling sub-assembly 40 comprises a heat exchange coil 44 disposed in intimate thermal contact with the body portion of the platen 34, and further comprises a heat exchange pump 46 effective for circulating a chilled fluid through the heat exchange coil 44. The specifics of heat exchange coil construction and heat exchange pumps are well known in the heat transfer arts, and therefore, they will not be described further herein. In operation, the chilled fluid is circulated through the heat exchange coil 44 to lower the temperature of the wafer 13 on the surface 35 of the platen 34 to a desired temperature. Once the wafer 13 is at the desired temperature, the deposition process can proceed. However, since the wafer 13 is now chilled, i.e. cooler than room temperature, the wafer 13 cannot thereafter be immediately removed from the deposition chamber because moisture from the air will condense on the chilled wafer. In this connection, the heating elements 38 are effective for quickly heating the wafer 13, i.e. raising the temperature of the platen back to room temperature, before removal of the wafer 13 from the deposition chamber. This procedure will effectively eliminate any chances of condensation forming on the wafers. It is also contemplated that the heating elements 38 may be effective for further raising the temperature of the wafer 13 up to a temperature of 100° C. to 300° C. for purposes of annealing the Parylene coating after deposition.

Referring to FIGS. 7 and 8B, the platen assembly 12 further comprises an electrostatic clamping device generally indicated at 48 for electrostatically clamping the semiconductor wafer 13 in intimate thermal contact with the platen surface 36. Since the wafer temperature is controlled primarily by means of heat conduction from the platen 34, it is important to maintain an intimate thermal contact of the wafer 13 with the platen surface 36. The electrostatic clamping device 48 provides an extremely simple way of maintaining an intimate thermal contact without cumbersome mechanical clamping devices. The electrostatic clamping device 48 is located on the surface 36 of the platen 34, and comprises an inter-digital printed circuit capacitor 50 sandwiched between two layers of a thermally conductive, dielectric material 52, 54 respectively. The circuit capacitor 50 is energized by a conventional electric source (not shown) having leads 56 insulated at 58 which pass through the platen 34 and connect to the capacitor 50 as indicated in FIG. 8B. The specific details of a representative-type electrostatic clamping device 48 are described in U.S. Pat. No. 4,184,188, the content of which is incorporated by reference herein.

Figure 4:
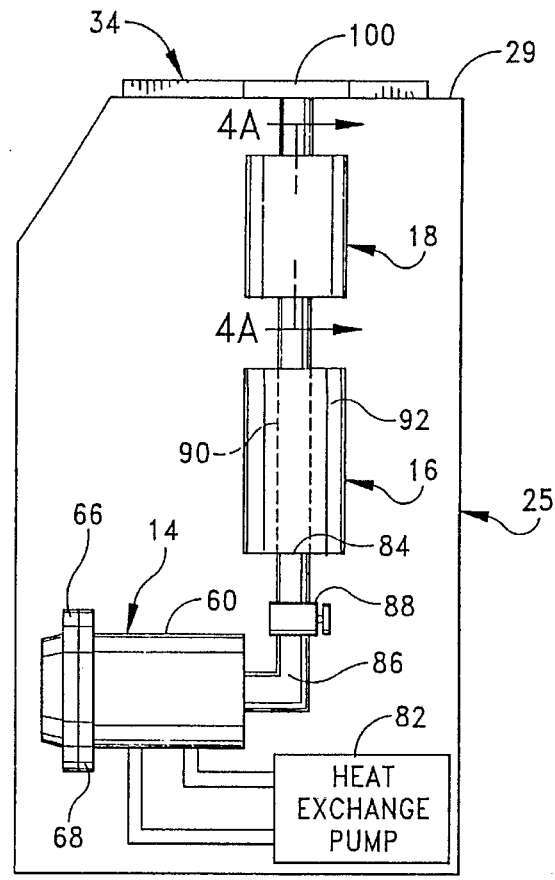
FIG. 4 is a cross-sectional view of the apparatus as taken along line 4—4 of FIG. 3.
Figure 5:
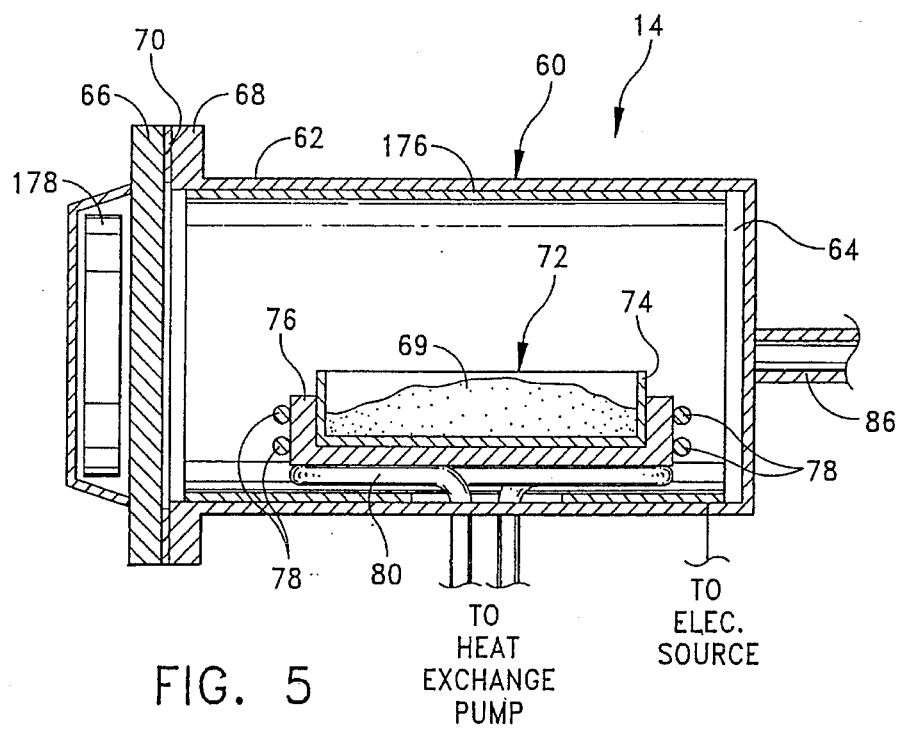
FIG. 5 is an enlarged cross-sectional view of the vaporization chamber.
Figure 4A:
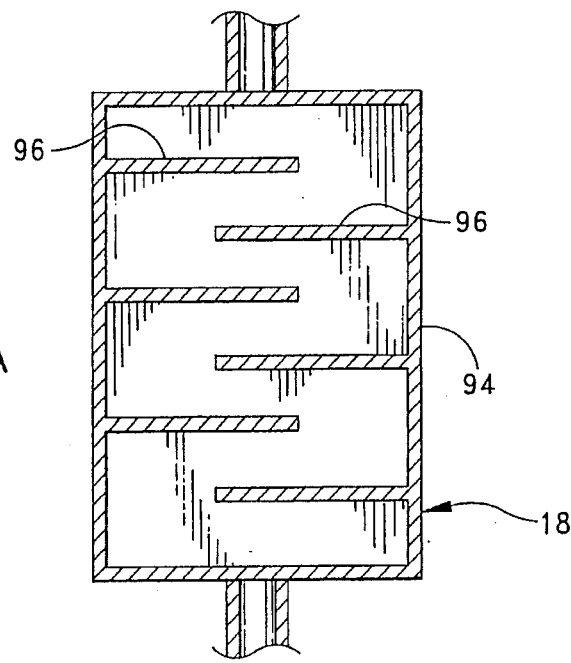
FIG. 4A is a cross-sectional view of the post-pyrolysis chamber as taken along line 4A—4A of FIG. 4.

Referring to FIGS. 1, 4 and 5, the vaporization chamber 14 comprises a cylindrical housing generally indicated at 60 having an inlet end 62 and an outlet end 64. The inlet end 62 of the housing 60 is provided with a hinged door 66 which is attached to a flange 68 of the housing 60. The hinged door 66 is movable between open and closed positions to permit selective access to the interior of the housing 60 for the placement of Parylene AF4 dimer 69 into the vaporization chamber 14. In order to maintain a vacuum seal at the door opening, the door 66 is provided with an elastomeric gasket 70. Located inside the vaporization chamber 14 is a dimer heating device generally indicated at 72 which is effective for vaporization of the dimer 69. The powdered AF4 dimer 69 is received in a removable dimer crucible 74, which is in turn received into a heat transfer receptacle 76. Alternatively, the dimer 69 may be received directly into the receptacle 76. The dimer crucible 74 and receptacle 76 are preferably fashioned from a thermally conductive metal, and the dimer crucible 74 is preferably dimensioned so as to fit into the receptacle 76 in intimate thermal contact with the receptacle 76 such that heat from the receptacle 76 is readily conducted to the dimer crucible 74 through contact. The heal transfer receptacle 76 is preferably heated by a plurality of electric heating elements 78 disposed around the receptacle 76 in intimate thermal contact with the receptacle 76. The electric heating elements 78 comprise a nichrome wire construction, suitably insulated, and wrapped around the receptacle. The electric heating elements 78 are operative for quickly heating the receptacle 76 to a temperature which is suitable for the vaporization of the dimer 69 which temperature is between about 70° C. and about 150°. It can therefore be seen that the dimer heating device 72 of the instant invention provides for quick and efficient heating of the dimer 69 to the required vaporization temperature.

The dimer heating device 72 further includes a cooling assembly for quickly cooling the heat transfer receptacle 76 to a temperature below the vaporization temperature of the dimer 69. The cooling assembly comprises a heat exchange coil 80 (FIG. 5) disposed in intimate thermal contact with the heat transfer receptacle 76 and a heat exchange pump 82 (FIGS. 1 and 4) for circulating a cooler fluid through the heat exchange coil 80. The specifics of heat exchange coil construction and heat exchange pumps are well known in the heat transfer arts, and therefore, they will not be described further herein. In order to effectively control rates of deposition of the Parylene AF4 onto the wafer 13, it is necessary to control the rate of vaporization of the dimer 69 into the deposition system. In this connection, the cooling assembly can be utilized to quickly cool the dimer to quench vaporization, i.e. reduce the rate of vaporization. Ideally, the circulating fluid would be maintained at a temperature only slightly below the vaporization temperature, such that temperature of the heat transfer receptacle 76 would only drop to a point effective to stop vaporization. The resulting temperature drop may only be that of several degrees. Accordingly, it can be seen that the heating and cooling mechanisms permit the temperature of the heat transfer receptacle 76 to be quickly cycled above and below the vaporization temperature to effectively control the rate of vaporization of the dimer.

The outlet end 64 of the vaporization chamber 14 is coupled to an inlet opening 84 of the pyrolysis chamber by a pipe 86. The pipe 86 extending between the vaporization chamber 14 and the pyrolysis chamber 16 preferably includes a throttle valve 88 for controlling the flow of vaporized dimer into the pyrolysis chamber 16. In coating operations, it has been found effective to utilize a throttle valve 88 to immediately stop the flow of vaporized dimer into the pyrolysis chamber 16 to stop the deposition process. In use, when it is desired to stop the coating process, i.e. when a desired coating thickness has been achieved, the throttle valve 88 is closed to prevent any further vapor flow through the system. The coated article can then be removed from the deposition chamber and replaced with another article to be coated. In this connection, when the throttle valve 88 is closed to stop flow, it is desirable to stop further vaporization of the dimer 69 within the vaporization chamber 14 as further vaporization will increase pressure within the vaporization chamber 14 and cause a rush of vapor into the system when the throttle valve 88 is reopened. Accordingly, the cooling assembly would be employed to quickly cool the dimer and quench vaporization.

The pyrolysis chamber 16 receives the vaporized dimer from the vaporization chamber 14, and is effective for super-heating the vaporized dimer to a predetermined pyrolysis temperature wherein the dimer is cleaved into monomer form. The construction of pyrolysis chamber 16 is conventional in the art comprising a tube 90 (broken lines), the walls of which are heated by an electric tube heater 92. The tube heater 92 is preferably effective for maintaining the pyrolysis chamber 16 at a temperature of about between about 600° C. and about 720° C., and more preferably at a temperature of about 690° C.

The outlet of the pyrolysis chamber 16 is coupled to an inlet of the post-pyrolysis chamber 18. The post pyrolysis chamber 18 comprises a cylindrical housing 94 having a plurality of baffle elements 96 disposed in the interior thereof. The monomer exiting from the pyrolysis chamber 16 passes through the post-pyrolysis chamber 18 on its way to the deposition chamber 20, wherein the post-pyrolysis chamber 18 is effective for capturing any unpyrolyzed dimer that may pass through the pyrolysis chamber 16. More specifically, the post-pyrolysis chamber 18 is maintained at a temperature of between about 22° C. and about 28° C., and more preferably at a temperature of about 25° C. (about room temperature). The post-pyrolysis chamber is maintained at its desired temperature by means of an external fan 98. With regard to capturing of the unpyrolyzed dimer, it has been found that the unpyrolyzed dimer, being twice as heavy as the reactive monomer, preferentially condenses, or deposits, in the post-pyrolysis chamber 18 when the post-pyrolysis chamber 18 is maintained at the indicated temperatures. Removal of the unpyrolyzed dimer before deposition is important in the coating of semiconductor wafers, as the unpyrolyzed dimer constitutes an impurity in the polymer chain which may locally effect dielectric constant and polymer surface characteristics.

The outlet of the post-pyrolysis chamber terminates in a fitting 100 located on the top wall 29 of the housing 25, and is coupled to the inlet pipe 30 of the deposition bell 20. In this regard, the inlet pipe 30 includes a complimentary fitting 102 which is received in mating engagement with the fitting 100 when the deposition bell 20 is received onto the platen 34. The fittings 100, 102 are provided with an elastomeric gasket 104 to provide a vacuum tight engagement.

Referring to FIGS. 2, 3, 10 and 11, the deposition bell 20 is frusto-conical in shape having a smaller diameter inlet end and a larger diameter outlet end. The outlet end of the deposition bell 20 is defined by a rim 106 which is received in mating engagement with the supporting surface 36 of the platen 34 to define a frusto-conical shaped deposition chamber. The particular shape of the deposition bell 20 minimizes deposition chamber volume and maximizes vapor flow over the surface of the wafer 13 supported on the platen 34 adjacent to the outlet end of the chamber. While the bell 20 is illustrated as being frusto-conical, it is to be understood that virtually any tapered arrangement of the bell 20, such as a pyramidal shape, would provide the desired minimization of volume and, and maximization of vapor flow. The deposition bell 20 further includes a filter assembly generally indicated at 108 disposed adjacent to the inlet end thereof for filtering out impurities in the vapor. The filter assembly is positioned in the interior of the bell 20 and comprises a filter element 110 captured between two opposing annular rings 112, 114 respectively secured to the interior wall of the bell 20 with appropriate removable fasteners, such as screws. The filter element 110 preferably comprises a microscopic filter material, such as PTFE, which permits sufficient gas flow and which is capable of filtering substantially all airborne impurities having a size larger than 0.1 micron. It is noted that the lower ring 114 is easily removable for periodic replacement of the filter element 110.

In order to draw a vacuum flow through the deposition bell 20 from the inlet end to the outlet end, the vacuum pump 22 is coupled to a plurality of outlets 116 in the rim 106 by means of a distribution manifold 118. The distribution manifold 118 comprises and annular channel which is secured to the outer surface of the rim 106. The outlet openings 116 communicate with an interior channel 120 of the manifold 118. A first, smaller diameter, outlet pipe 122 is connected to the manifold 118 in a predetermined location, and the plurality of outlet openings 116 are distributed around the periphery of the rim 106 in a distribution pattern intended to equalize the vacuum flow throughout the chamber. More specifically, it can be seen in FIG. 11, that there are more outlet openings 116 further away from the connection point of the outlet pipe 122 than adjacent to the outlet pipe 122. In other words, the cross-sectional flow area are the openings 116 increases further and further away from the vacuum source 122.

Figure 6:
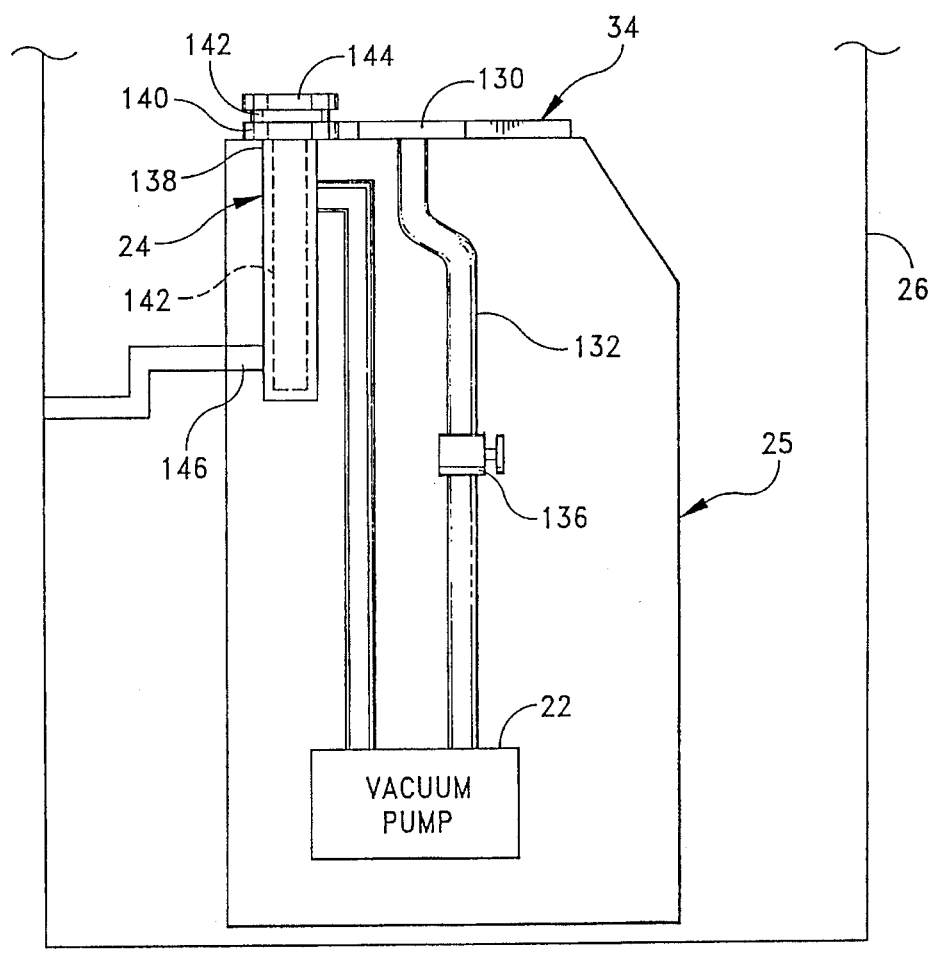
FIG. 6 is another cross-sectional view of the apparatus as taken along line 6—6 of FIG. 3.

While the described vacuum flow/manifold arrangement is ideal for drawing a uniform vapor flow over the surface of the wafer 13 during the deposition process, i.e. maintaining an operating vacuum pressure within the chamber system, the cross-sectional flow area of the first outlet pipe 122 is not sufficient to provide a quick evacuation of the chamber system down to the operating pressure. In other words, a significant amount of time is required to pump down the chamber system to the operating pressure utilizing the first outlet pipe 122 by itself. Accordingly, in order to reduce the vacuum cycle time, the deposition bell 20 is provided with a vacuum by-pass arrangement illustrated in FIGS. 2 and 3. In this regard, the inlet of the deposition bell 20 is connected to a second, larger diameter outlet pipe 32, which is provided with a by-pass valve 124 adjacent the deposition bell inlet. The smaller diameter outlet pipe 122 merges with the larger diameter outlet pipe 32 at fitting 126, and the outlet pipe 32 is coupled to the vacuum pump 22. More specifically, the outlet pipe 32 terminates in a fitting 128 which engages with a vacuum fitting 130 on the top wall 29 of the housing 25. The fitting 130 is coupled to the vacuum pump 22 by another pipe section 132 (FIG. 6). The outlet pipe fitting 128 is received in mating engagement with housing fitting 130 when the deposition bell 20 is received on the platen 34. The fittings 128, 130 are provided with an elastomeric gasket 134 to maintain a vacuum tight engagement. In operation, by-pass valve 124 would remain open, wherein initial pump-down of the chamber system would be accomplished through both the first and second outlet pipes 122, and 32. As soon as a desired operating pressure is achieved, the by-pass valve 124 is closed, and the desired pressure is maintained solely by the first outlet pipe 122 connected to the distribution manifold 118.

Referring to FIG. 6, the pipe section 132 is coupled to the inlet of the vacuum pump 22, and is preferably provided with a valve 136 for selectively providing a vacuum to the chamber system. The valve 136 is located downstream of the fitting 130 so that the deposition bell assembly 20 can be removed from the top of the housing 25 when the valve 136 is closed. The vacuum pump 22 comprises an oil free, or dry, vacuum pump, such as a DRYTEL SERIES dry pump manufactured by ALCATEL, Inc. The outlet of the vacuum pump 22 is coupled to an inlet of the cold trap 24 which comprises a cylindrical tube 138 having an open top. The tube 138 is mounted to the top wall 29 of the housing 25 and includes a fitting 140 at the open top thereof. A cylindrical finger element 142 having a complementary flange 144 at the top thereof is slidably received into the tube 138 with the fittings 138, 140 engaging at the top. The fittings 138, 140 are provided with an elastomeric gasket 142 for a vacuum tight engagement. The finger element 142 is preferably cooled by means of liquid nitrogen received in a cylindrical opening in the top of the finger element 142. The outlet of the cold trap 24 opens to ambient atmosphere by means of a pipe 146. In operation, any free monomer which did not deposit in the deposition chamber deposits onto the surface of the cold finger 142 disposed in the cold trap chamber.

The use of an oil-free, dry pump is significant in terms of its use with a Parylene AF4 deposition apparatus. The prior art parylene deposition device typically utilized a cold trap directly connected to the deposition chamber outlet, and a conventional vacuum pump downstream of the cold trap. The primary purpose of placing the cold trap between the deposition chamber and the vacuum pump was to trap any excess monomer and prevent the monomer from flowing through the pump where it could deposit internally and interfere with operation of the pump and/or contaminate the oil. The prior Parylene materials (Parylene C, D, and N) effectively deposited onto surfaces having a temperature of about 15°–40° C. which just happens to be the normal operating temperatures of such pumps. The cold trap was further effective for preventing back-streaming of oil vapors into the deposition chamber. Hence, the cold trap was necessary to trap excess monomer from depositing onto the internal surfaces of the vacuum pump, and prevent oil vapor from back-streaming into the deposition chamber.

However, placement of the cold trap in direct communication with the deposition chamber is known to cause at least one drawback. It has been found that the cold trap creates a cryo-pumping arrangement which has been shown to rapidly draw monomer through the system faster than the background atmosphere is pumped by the vacuum pump. The result is that the monomer is drawn very quickly through the deposition chamber, and is not allowed sufficient time to polymerize. The problem has been compensated for by utilizing excess dimer, and increasing coating cycle time. This was not previously found to be that significant a drawback in that the cost of Parylene C, D, and N is not prohibitive.

It has been found that the newer parylene AF4 will not deposit onto heated substrates in the range of 15°–40° C., and thus the prior problem of pump deposition is eliminated. However, the use of an oil pump still leaves the problem of oil vapor back-streaming into the deposition chamber. Since one of the intended uses of the apparatus 10 is in the coating of highly sensitive semiconductor wafers, the presence of any foreign vapors is not desired. The instant arrangement of an oil-free vacuum pump effectively eliminates the need for an upstream cold trap, and eliminates the stated drawbacks of the prior art devices. Furthermore, since the vacuum pump is connected directly to the deposition chamber outlet, both the background gasses and the monomer vapor are drawn at an equal rate through the deposition chamber, thus reducing the amount of dimer needed to effectuate the desired coating thickness. This is highly significant when considered in conjunction with the high cost of Parylene AF4 dimer, and the desire the reduce the quantity utilized for each deposition cycle.

Referring to FIG. 1, the parylene deposition apparatus further comprises an electronic controller generally indicated at 148 operative for electronically controlling all aspects of the deposition process, including temperature, and pressure regulation. The controller 148 comprises a conventional microprocessor device 150 which is programmed according to conventional programming techniques well known in the electronics arts. With regard to temperature regulation, the heating and cooling devices of the vaporization chamber 14, pyrolysis chamber 16, post-pyrolysis chamber 18, and platen assembly 12 are each connected to the controller 148 by appropriate electrical connections. Furthermore, the vaporization chamber 14, pyrolysis chamber 16, post-pyrolysis chamber 18, and platen assembly 12 are each provided thermocouples 152, 154, 156, 158 respectively, or other appropriate device for measuring temperature. The thermocouples 152, 154, 156, 158 are connected to the controller 148 by appropriate electrical connections wherein the desired temperatures of the various chambers are monitored by various set point comparators 160, and wherein the heating and cooling devices are controlled by the controller 148 responsive to the measured temperatures to maintain the desired set point temperatures. With regard to pressure regulation, the vacuum pump 22 and associated valves 124, 136 are connected to the controller 148 for automated control of the vacuum system. The deposition bell 20 is provided with a thermistor gauge 162 for measuring pressure within the deposition chamber, and the thermistor gage 162 is connected to the controller 148 wherein the vacuum pump 22 and valves 124, 136 are controlled responsive to measured pressure. Furthermore, the throttle valve 88 adjacent the vaporization chamber 14 is also connected to the controller 148 for automated control of the valve 88, and the electrostatic clamping device 48 is connected to the controller 148 for automated control of the clamping device 48.

Referring to FIGS. 1, 7, 8A, and 9, the instant parylene deposition apparatus still further includes a quartz-crystal thickness/vaporization rate control system including a quartz crystal assembly generally indicated at 164 disposed within the deposition chamber. More specifically, the quartz crystal assembly 164 is disposed within a recess 166 located on the peripheral edge of the platen 34. The crystal assembly 164 includes a disc-shaped crystal 168 and two electrical leads 170, 172 mounted to opposing sides of the crystal 168. In operation, the parylene monomer vapor deposits onto the surface of the crystal 168 varying the vibration frequency of the crystal 168. The rate of change in frequency can be directly correlated with rate of deposition of the parylene monomer onto the crystal 168, and thus onto the substrate to be coated. The crystal 168 is electrically connected to an oscillator 174 for measuring the frequency of the crystal 168 which varies with the thickness of the coating on the crystal 168. The oscillator 174 is connected to the microcontroller 148 which measures the frequency changes of the crystal and continuously calculates the rate of deposition of the parylene monomer vapor. Furthermore, the microprocessor 150 is connected to a set point comparator 160 which compares the calculated deposition rate to a set or desired deposition rate. The microprocessor 150 then operates to increase or decrease the temperature of the vaporization chamber 14, or to open or close the throttle valve 88 to provide more or less parylene dimer to the system. In other words, the controller 148 monitors the changes in frequency of the crystal 168 as parylene is deposited onto the crystal 168, and adjusts the amount of parylene dimer released into the system by adjusting the temperature of the vaporization chamber 14, and controlling the throttle valve 88. The oscillator 174 and set point comparator 160 are well known items in the electronics arts, and therefore they will not be described further.

A primary consideration in development of the instant apparatus is the extremely high cost of Parylene AF4 materials. In order to make Parylene AF4 coatings cost efficient, it is important that deposition efficiency be relatively high. Since Parylene AF4 has an affinity to deposit on only cool substrates, it is desirable to heat the internal walls of several areas of the apparatus 10 to prevent the dimer and monomer from depositing onto the internal walls of the apparatus. More specifically, the internal walls of the vaporization chamber 14 are provided with independent heating elements 176 to prevent the vaporized dimer from depositing onto the walls of the chamber 14 after vaporization. Furthermore, the door 66 of the vaporization chamber 14 is provided with a heating element 178 to prevent deposition onto the inside surface of the door 66. The walls of the deposition bell 20 are also provided with heating elements 180 to prevent the monomer from depositing onto the internal walls of the deposition chamber. In this connection, the walls of the deposition bell 20 should be heated to a temperature of between about 30 and about 50° C. to effectively prevent deposition. Still further, the by-pass valve 124 adjacent the inlet of the deposition bell 20 is provided with a heating element 182 to prevent the monomer from depositing onto the valve surface before reaching the deposition chamber. Even further still, it is preferred to heat the filter element 110 to prevent deposition onto the filter. In the instant arrangement, the filter element 110 is effectively heated by the heating element 180, thus eliminating the need for a separate heating element.

As described hereinabove, the entire apparatus 10 is enveloped in an atmospheric shroud 26, and provided with an inert nitrogen atmosphere. The purpose of the shroud 26 and nitrogen atmosphere is to exclude oxygen from the deposition chamber during evacuation and subsequent coating cycle, thus allowing the coating process to be carried out in an oxygen free environment. Currently, the prior art parylene coating devices operate in normal atmospheric conditions. This allows for oxygen to be present as a constituent background gas, and as a constituent of any atmospheric leakage into the chamber during the coating cycle. It has been found that oxygen can chemically combine with the Parylene reactive monomer in the pyrolysis and post pyrolysis zones 16, 18 respectively, and thereby cause weak polymer bonds. Accordingly, the shroud 26 is effective to isolate the apparatus 10 in an inert nitrogen atmosphere before pump down, and during the coating cycle. Preliminary test results have shown that the inert atmosphere provides a purer, denser and more stable coating. While nitrogen is specifically described herein as the preferred atmospheric element, it is to be understood that other inert gases, such as argon, are also suitable for the intended purpose.

A representative use of the apparatus 10 will be described by way of the following example wherein an 8 inch silicon wafer 13 will be coated with a 1 micron layer of Parylene AF4. With the vacuum control valve 136 closed, the deposition bell assembly 20 is removed and the wafer 13 placed in the center of the platen 34. The electrostatic clamp 48 is activated to hold the wafer 13 in position, and the deposition bell 20 is replaced. Prior to evacuation of the chambers, about 1 gram of Parylene AF4 dimer is placed into the dimer crucible 74, and the crucible 74 placed in the heat transfer receptacle 76 in the vaporization chamber 14. The shroud 26 is then flooded with nitrogen to provide an inert atmosphere around the apparatus 10. The vacuum control valve 135 and vacuum by-pass valve 124 are both opened to begin evacuation of the chamber systems. Chamber pressure is preferably reduced to about 5 microns mercury (Hg), after which the by-pass valve 124 is closed. The pressure is thereafter maintained at 5 microns Hg by only the smaller vacuum manifold outlets 116/122. The heat transfer receptacle 76 is then heated to a temperature of about 90° C. to begin vaporization of the dimer 69. The pyrolysis chamber 16 is preheated to about 690° C., and when the vaporized dimer passes through the pyrolysis chamber 16, substantially all of the dimer is pyrolyzed into monomer form and passes out through the post-pyrolysis chamber 18. The post-pyrolysis chamber 18, which is maintained at a temperature of about 25° C. (about room temperature), captures any unpyrolyzed dimer which manages to escape the pyrolysis chamber 16. The AF4 monomer vapor is drawn into the deposition chamber 20, over the surface of the wafer 13, and outward through the distribution manifold 118 wherein the monomer vapor deposits onto the cooled wafer 13. As stated previously, the walls of the deposition bell 20 are heated to prevent deposition onto the chamber walls. Vaporization of the entire gram of dimer should result in about a 1 micron layer of Parylene AF4 of the wafer 13. However, the quartz crystal control 164 monitors the coating thickness and controls vaporization of the dimer to achieve the desired 1 micron coating thickness. Any excess undeposited monomer drawn through the manifold outlet 122 is captured in the cold trap 124. After the desired thickness of coating is achieved, the throttle valve 88 is closed to prevent any further deposition. While maintaining the vacuum, the temperature of the wafer 13 is then brought up to room temperature by activating the platen heating elements 38. Once the wafer 13 is at the desired room temperature, the vacuum valve 136 is closed, the deposition bell 20 removed, the electrostatic clamp 48 deactivated, and the wafer 13 removed from the platen 34.

It can therefore be seen that the instant invention provides a unique and effective parylene deposition apparatus 10 which is uniquely suited for the deposition of Parylene AF4. The heated and cooled platen 34 provide an effective means for supporting a wafer 13 for deposition and for controlling the temperature of the silicon wafer 13 during processing. The electrostatic clamping device 48 provides an effective means for clamping the wafer in intimate thermal contact with the platen 34 without physically clamping the delicate wafer structure. The vaporization chamber 14 is effective for the quick and efficient heating and cooling of the dimer to effectively control the dimer vaporization rate, and the associated throttle valve 88 effective for the controlled release of vaporized dimer into the deposition system. The baffled post-pyrolysis chamber 18 is effective for capturing dimer which exits the pyrolysis chamber. The dome-shaped deposition bell 20 is unique and effective for minimizing deposition chamber volume while maximizing vapor flow over the surface of the platen 34. The vacuum manifold arrangement 118 attached to the deposition bell 20 enhances vapor flow directly over the surface of the platen 34 and the vacuum by-pass arrangement facilitates quick and efficient pump-down of the chamber system in preparation for deposition. The quart crystal rate controller 164 also provides an effective means for accurately controlling deposition rate onto the wafers. For these reasons, the instant invention is believed to represent a significant advancement in the art.

While there is shown and described herein certain specific structure embodying the invention, it will be manifest to those skilled in the art that various modifications of the parts may be made without departing from the spirit and scope of the inventive concept and that the same is not limited to the particular forms herein shown and described except insofar as indicated by the scope of the appended claims.

What is claimed is:

1. A parylene deposition apparatus comprising:

a vaporization chamber;

a pyrolysis chamber coupled to said vaporization chamber;

a post-pyrolysis chamber coupled to said pyrolysis chamber for receiving gaseous parylene monomer, said post pyrolysis chamber having interior walls which are maintained at a predetermined temperature, said interior walls being effective for capturing unpyrolyzed parylene dimer molecules exiting said pyrolysis chamber;

a deposition chamber coupled to said post-pyrolysis chamber for receiving said gaseous parylene monomer;

filter means disposed in the flow path of said gaseous parylene monomer between said post-pyrolysis chamber and a substrate to be coated in said deposition chamber, said filter being operative for filtering out impurities in said parylene monomer prior to deposition onto said substrate; and vacuum means for creating sub-atmospheric pressure conditions within said deposition chamber, said post-pyrolysis chamber, said pyrolysis chamber, and said vaporization chamber.

2. The parylene deposition apparatus of claim 1, wherein said filter means includes a filter material comprising PTFE.

3. The parylene deposition apparatus of claim 1 wherein said filter means is located in said deposition chamber adjacent an inlet of said deposition chamber.

4. The parylene deposition apparatus of claim 3 wherein said filter means comprises a filter material captured between two complementary rings secured to an interior surface of the deposition chamber.

5. The parylene deposition apparatus of claim 1 further comprising means for heating the filter means.

6. A parylene deposition apparatus comprising:

a vaporization chamber;

a pyrolysis chamber coupled to said vaporization chamber;

a deposition chamber coupled to said pyrolysis chamber for receiving gaseous parylene monomer;

filter means disposed in the flow path of said gaseous parylene monomer between said pyrolysis chamber and a substrate to be coated in said deposition chamber, said filter being operative for filtering out impurities in said parylene monomer prior to deposition onto said substrate; and vacuum means for creating sub-atmospheric pressure conditions within said deposition chamber, said pyrolysis chamber and said vaporization chamber.

7. The parylene deposition apparatus of claim 6, wherein said filter means includes a filter material comprising PTFE.

8. The parylene deposition apparatus of claim 6 wherein said filter means is located in said deposition chamber adjacent an inlet of said deposition chamber.

9. The parylene deposition apparatus of claim 8 wherein said filter means comprises a filter material captured between two complementary rings secured to an interior surface of the deposition chamber.

10. The parylene deposition apparatus of claim 6 further comprising means for heating the filter means.

* * * * *